(12) United States Patent
Sirard et al.

(10) Patent No.: US 9,666,427 B2
(45) Date of Patent: May 30, 2017

(54) METHOD OF COLLAPSE-FREE DRYING OF HIGH ASPECT RATIO STRUCTURES

(71) Applicant: Lam Research Corporation, Fremont, CA (US)

(72) Inventors: Stephen M. Sirard, Austin, TX (US); Diane Hymes, San Jose, CA (US); Olivier B. Postel, Riegersdorf (AT)

(73) Assignee: LAM RESEARCH CORPORATION, Fremont, CA (US)

( * ) Notice: Subject to any disclaimer, the term of this patent is extended or adjusted under 35 U.S.C. 154(b) by 798 days.

(21) Appl. No.: 13/924,314

(22) Filed: Jun. 21, 2013

(65) Prior Publication Data
US 2014/0373384 A1 Dec. 25, 2014

(51) Int. Cl.
| F26B 3/00 | (2006.01) |
| H01L 21/02 | (2006.01) |
| H01L 21/67 | (2006.01) |

(52) U.S. Cl.
CPC .. *H01L 21/02057* (2013.01); *H01L 21/02082* (2013.01); *H01L 21/67034* (2013.01)

(58) Field of Classification Search
CPC ......... H01L 21/02041; H01L 21/02057; H01L 21/67034; H01L 21/02082; H01L 21/0335; G03F 7/40
USPC .......................................................... 34/357
See application file for complete search history.

(56) References Cited

U.S. PATENT DOCUMENTS

| 6,072,006 | A * | 6/2000 | Bantu | C08F 261/00 525/262 |
| 6,337,277 | B1 * | 1/2002 | Chou | H01L 21/31138 257/E21.256 |
| 7,687,406 | B2 * | 3/2010 | Daley | H01L 21/0335 438/725 |
| 8,058,178 | B1 | 11/2011 | Goto et al. | |
| 8,187,951 | B1 | 5/2012 | Wang et al. | |
| 2002/0132184 | A1 * | 9/2002 | Babcock | G03F 7/30 430/270.1 |
| 2002/0168785 | A1 * | 11/2002 | Paz de Araujo | H01L 21/02197 438/3 |
| 2003/0045098 | A1 * | 3/2003 | Verhaverbeke | H01L 21/67069 438/689 |
| 2005/0106493 | A1 * | 5/2005 | Ho | G03F 7/0035 430/270.1 |
| 2011/0189858 | A1 * | 8/2011 | Yasseri | H01L 21/02057 438/694 |
| 2013/0143406 | A1 * | 6/2013 | Hsu | G03F 7/42 438/694 |
| 2014/0373384 | A1 | 12/2014 | Sirard et al. | |

OTHER PUBLICATIONS

U.S. Appl. No. 13/924,314, filed Dec. 25, 2014, Sirard et al.
U.S. Appl. No. 14/489,615, filed Sep. 18, 2014, Ratchana Limary.

* cited by examiner

*Primary Examiner* — Kenneth Rinehart
*Assistant Examiner* — Bao D Nguyen

(57) ABSTRACT

A method, for drying an etched layer with a plurality of structures with etched spaces between the plurality of structures is provided. A liquid is provided within the spaces on the etched layer. The liquid is displaced with a drying solution with a solvent. Some of the solvent is removed from the drying solution to form a solid from the solution, wherein the solid at least fill half the height of the etched high aspect ratio spaces. The solid is removed.

19 Claims, 6 Drawing Sheets

METHOD OF COLLAPSE-FREE DRYING OF HIGH ASPECT RATIO STRUCTURES

BACKGROUND OF THE INVENTION

The present invention relates to the formation of semiconductor devices. More specifically, the invention relates to an apparatus or method for removing liquids from a substrate during the formation of semiconductor devices.

During semiconductor wafer processing, wet processing requires the subsequent removal of liquid from semiconductor devices.

As semiconductor devices continue to scale down to smaller sizes, higher aspect ratio structures are required to achieve the desired device performance. The fabrication of microelectronic/semiconductor devices requires a repetitive flow of multiple processing steps such as, material deposition, planarization, feature patterning, feature etching, and feature cleaning. The drive towards higher aspect ratio structures creates processing challenges for many of these traditional fabrication steps. Wet processes such as etch and clean, which typically make up greater than ~25% of the process flow, are particularly challenging on high aspect ratio features due to the capillary forces that are generated during drying. The strength of these capillary forces are dependent on the surface tension and contact angle of the etch, clean, or rinse fluids that are being dried, as well as the feature spacing and aspect ratio. If the forces generated during drying are too high, then the high aspect ratio features will collapse onto each other and stiction may occur. Feature collapse and stiction will severely degrade the device yield.

SUMMARY OF THE INVENTION

To achieve the foregoing and in accordance with the purpose of the present invention, a method, for drying an etched layer with a plurality of structures with etched spaces between the plurality of structures is provided. A liquid is provided within the spaces on the etched layer. The liquid is displaced with a drying solution with a solvent. Some of the solvent is removed from the drying solution to form a solid from the solution, wherein the solid at least fill half the height of the etched high aspect ratio spaces. The solid is removed.

In another manifestation of the invention, an apparatus for drying a wet substrate is provided. A chamber for receiving the wet substrate is provided. A wet transfer station transfers the wet substrate into the chamber. An electrostatic chuck (ESC) for supporting and electrostatically clamping the wet substrate is within the chamber. A bracing drying solution source is provided. A bracing drying solution source dispenser dispenses bracing drying solution from the bracing drying solution source to the wet substrate. A motor for spinning the substrate is provided. A downstream plasma source for providing a downstream plasma into the chamber is included. A temperature controller controls the temperature of the substrate. A vacuum pump is in fluid connection with the chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the current and prior art, alternative rinsing liquids with lower surface tension than deionized water have been implemented to prevent feature collapse. While this method has been successful for lower aspect ratio structures, it suffers the same collapse and stiction issues as deionized water at higher aspect ratios and smaller feature spacing. This failing is due to the fact that these lower surface tension fluids still possess a finite surface tension that generates forces during drying that are too strong for the fragile features. An alternative method to dry high aspect ratio structures is to dissolve and flush the rinsing fluid with a supercritical fluid. Supercritical fluids should generally be free of surface tension and thus eliminate the capillary forces that result in feature collapse. Despite the advantages of supercritical fluids, there are several technical and manufacturing challenges in implementing these fluids. These challenges include high equipment and safety costs, long process times, variable solvent quality during the process, extreme process sensitivity due to the diffuse and tunable nature of the fluid, and wafer defectivity/contamination issues arising from the interaction of the fluid with the chamber parts. Another strategy for preventing collapse of high aspect ratio structures is to deposit permanent periodic mechanical bracing structures that support the features. There are several tradeoffs with this approach including higher cost and process complexity that negatively impact throughput and yield. Furthermore, due to its permanent nature, periodic bracing is not a robust solution since it is limited to certain types of structures. Thus, alternative methods and systems for damage-free removal of liquids from semiconductor/microelectronic devices are desirable.

EXAMPLE

Figure 1:
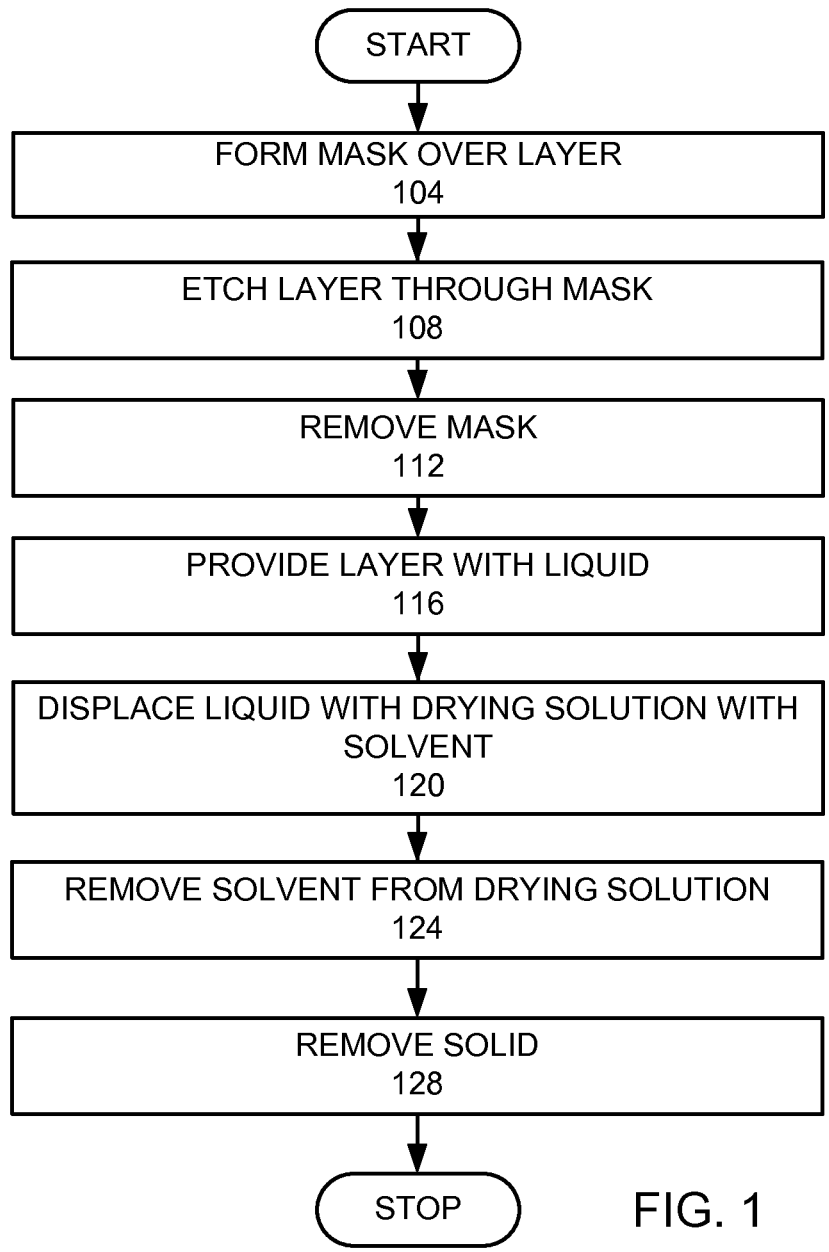
FIG. 1 is a high level flow chart of an embodiment of the invention.
Figure 2A:
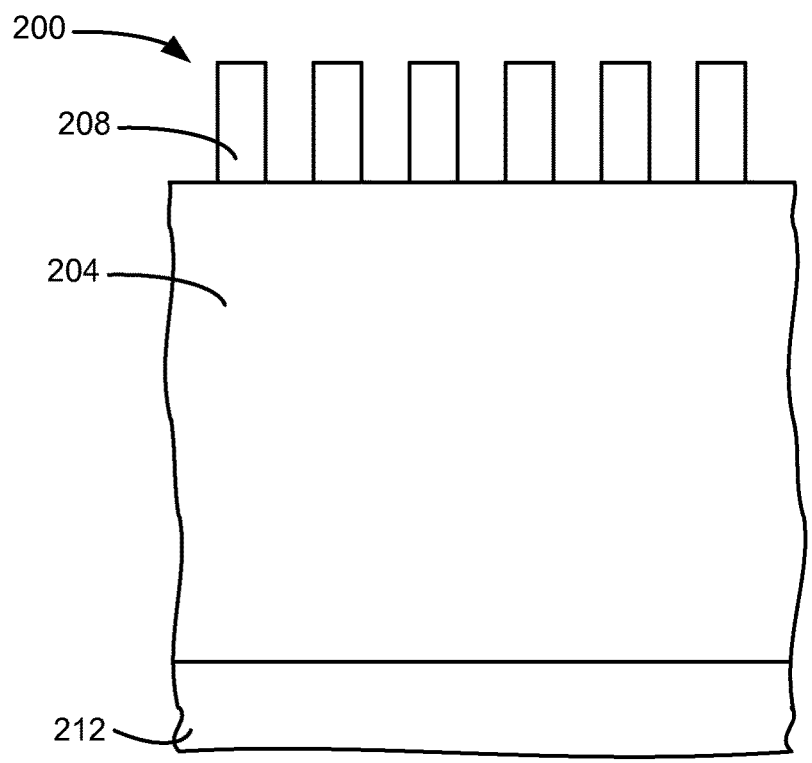
FIGS. 2A-F are schematic cross-sectional views of a stack processed according to an embodiment of the invention.

In an example of an implementation of the invention, a mask is formed over a layer (step 104). In this embodiment, the layer is silicon or metal based. FIG. 2A is a schematic cross-sectional view of a stack 200 with a layer 204 over which a patterned mask 208 is provided in an embodiment of the invention. In this example, the layer 204 is a silicon based or metal based layer, such as Si, $SiO_2$, SiN, or TiN.

The layer 204 may be over a substrate 212. One or more layers may be between the layer 204 and the substrate 212. In other embodiments, the layer 204 may be part of the substrate 212. In an example, the layer is tetraethyl orthosilicate (TEOS), which is a silicon based silicon oxide material.

Figure 2B:
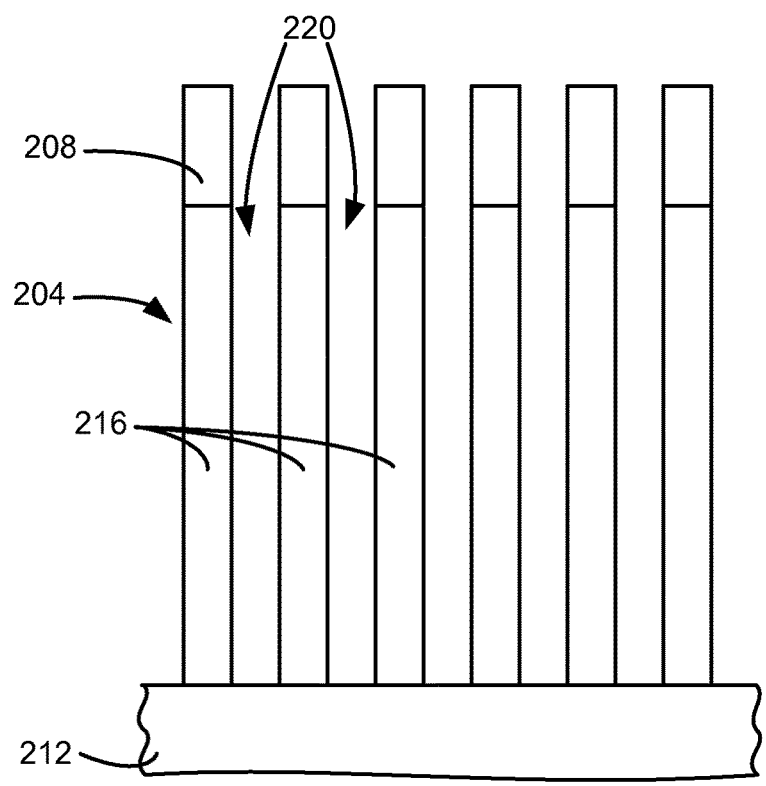

The layer 204 is etched through the mask 208 (step 108). FIG. 2B is a schematic cross-sectional view of the stack 200 after the layer 204 has been etched, forming a plurality of high aspect ratio structures 216 with height to width aspect ratios of at least 10:1 and with a plurality of spaces 220 between the plurality of high aspect ratio structures 216. In this example, a dry etch is used to etch the layer 204. However, in other embodiments, a wet etch may be used. In this example, the spaces are etched to a depth of 340-342 nm with a feature width of 30-32 nm.

Figure 2C:
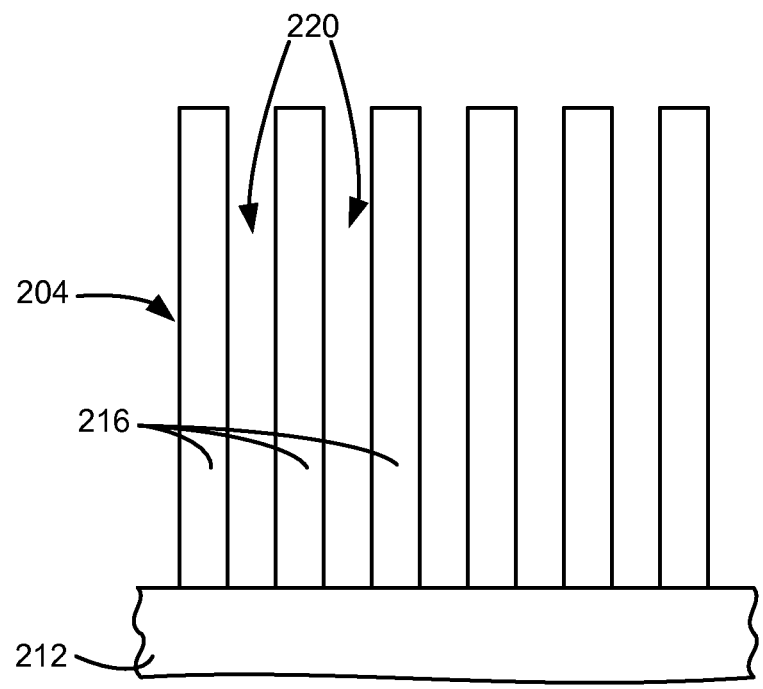

The mask is removed (step 112). FIG. 2C is a schematic cross-sectional view of the stack 200 after the mask has been removed. In this embodiment, the mask may be removed by a dry process. For example, the ashing process may be used to remove the mask by ashing the mask. In another embodiment, a wet process may be used to remove the mask.

Figure 2D:
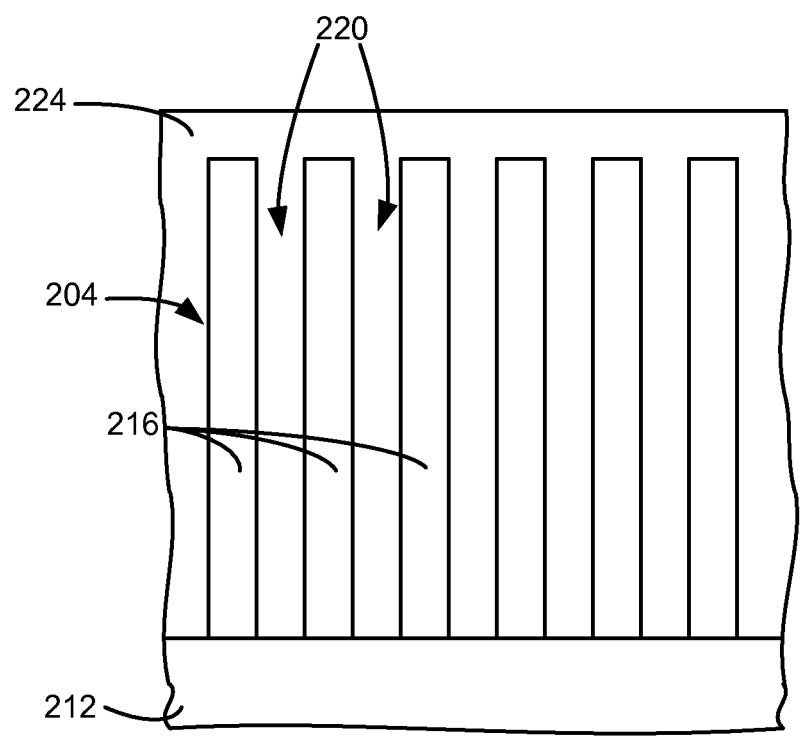
Figure 2E:
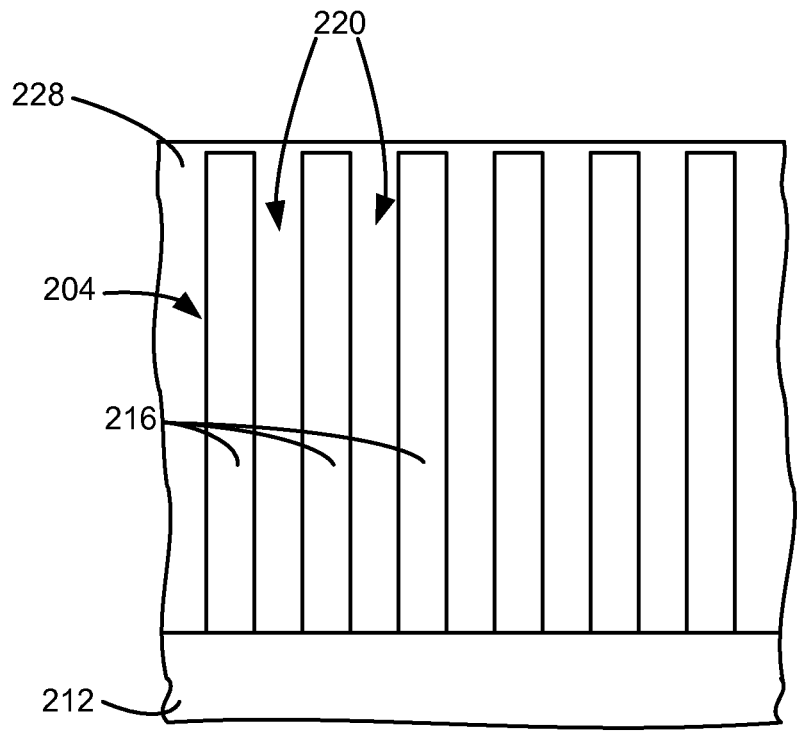
Figure 2F:
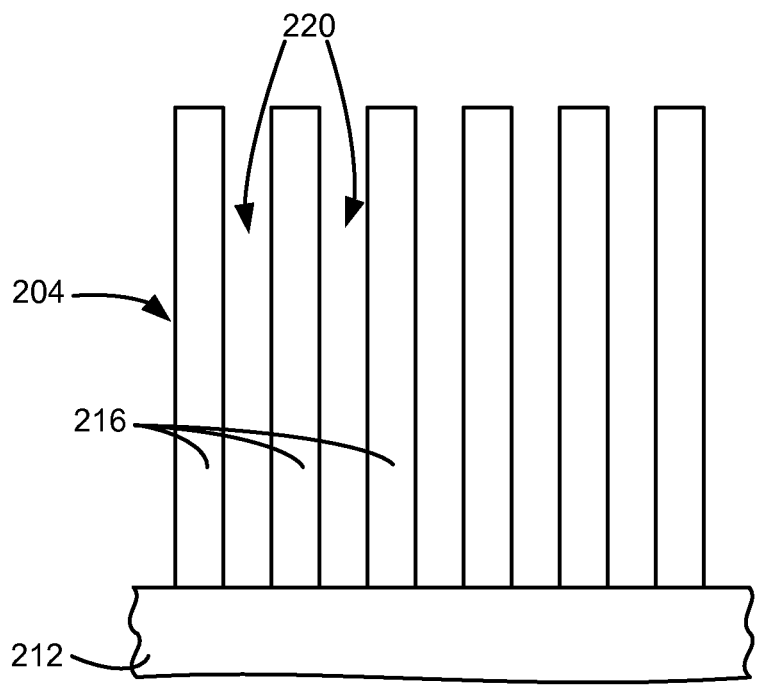

The layer is provided with a liquid (step 116). FIG. 2D is a schematic cross-sectional view of the stack 200 with a liquid 224 provided on the layer 204, so that the liquid 224 fills the spaces between the plurality of high aspect ratio structures 216. The liquid 224 may be provided for a wet process, such as a cleaning or rinsing after ashing. In another embodiment, the liquid may be used to remove the mask, so that the removing of the mask (step 112) and providing the liquid 224 (step 116) are simultaneous. In another embodiment, the etching of the layer 204 (step 108) may use a wet etch, so that the etching the layer 204 (step 108) and the providing the liquid 224 (step 116) are simultaneous. In such an embodiment, the mask may be removed (step 112) in a subsequent step or may be removed simultaneously with the etching the layer 204 (step 108) and the providing the liquid 224 (step 116). Other combinations may be used to ultimately provide a layer 204 with high aspect ratio features 216 with spaces 220 filled with a liquid 224. In this example, a hydrogen fluoride (HF) solution is used to clean the post etch structures.

Figure 3:
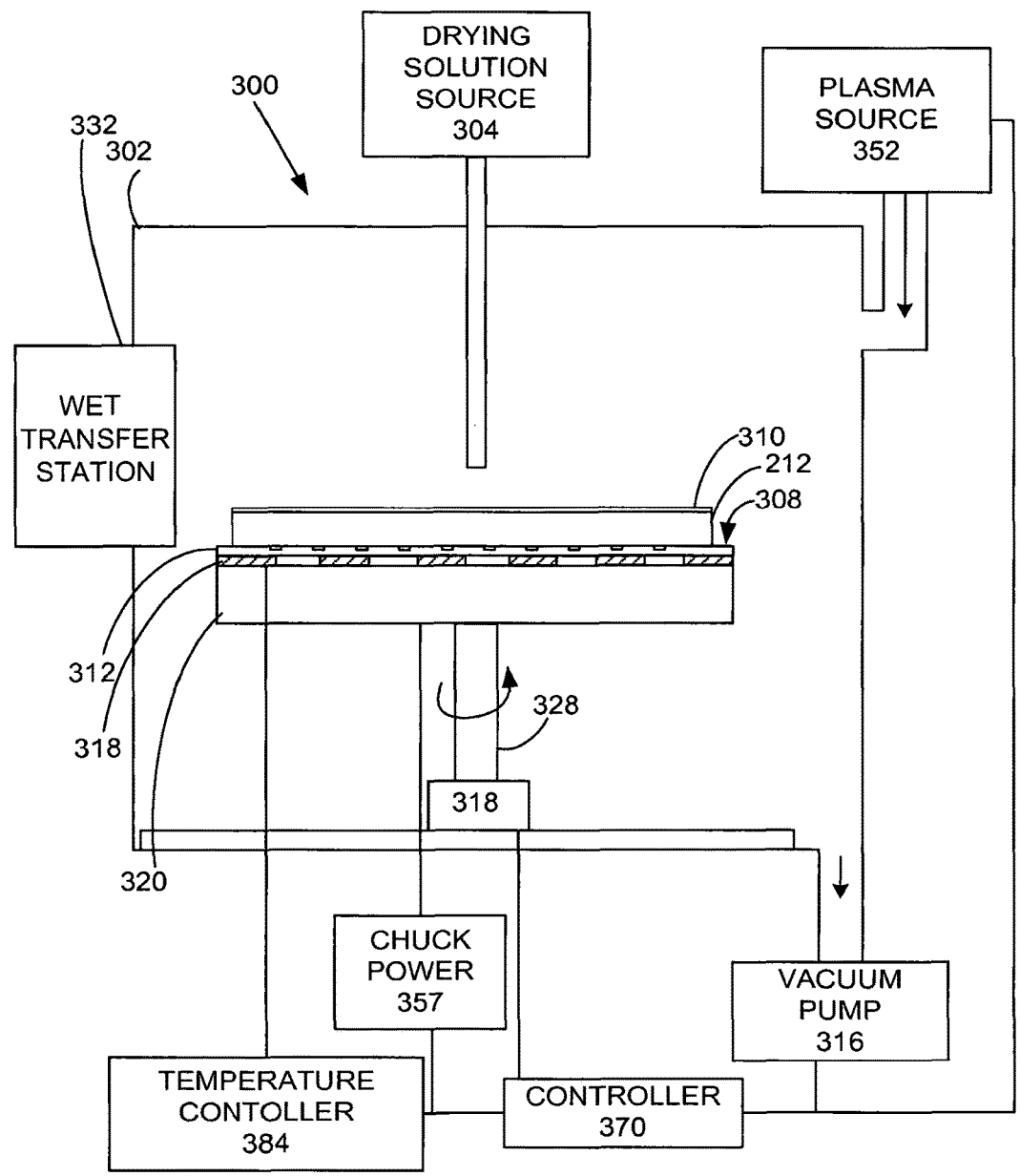
FIG. 3 is a schematic illustration of a drying device used in an embodiment of the invention.

The substrate 212 may be transferred to a sacrificial bracing drying system. FIG. 3 is a schematic view of an example of a sacrificial bracing drying system 300 that may be used in this embodiment of the invention. A drying solution source 304 is in fluid connection with a sacrificial bracing drying chamber 302. An electrostatic chuck (ESC) 308 is placed in the bracing drying chamber 302 to support a substrate 212, such as a wafer. The sacrificial bracing drying system 300 further comprises a wet transfer station 332, which provides a method for transferring the substrate 212 on which a liquid 310 is disposed into the sacrificial bracing drying chamber 302 and provides a vacuum seal through which the atmosphere can be controlled. The sacrificial bracing drying system 300 further comprises a vacuum pump 316. A downstream plasma source 352 is in fluid connection with the sacrificial bracing drying chamber 302.

In this embodiment the ESC 308 comprises a contact layer 312, a thermal system layer 318, and a body 320. A temperature controller 384 is electrically connected to the thermal system layer 318. A chuck power supply 357 provides a clamping voltage to electrostatically clamp the substrate 212 onto the ESC 308. An axel 328 is connected between the ESC 308 and a motor 318.

A controller 370 is controllably connected to the temperature controller 384, the chuck power supply 357, the drying solution source 304, the vacuum pump 316, and the motor 318.

Figure 4:
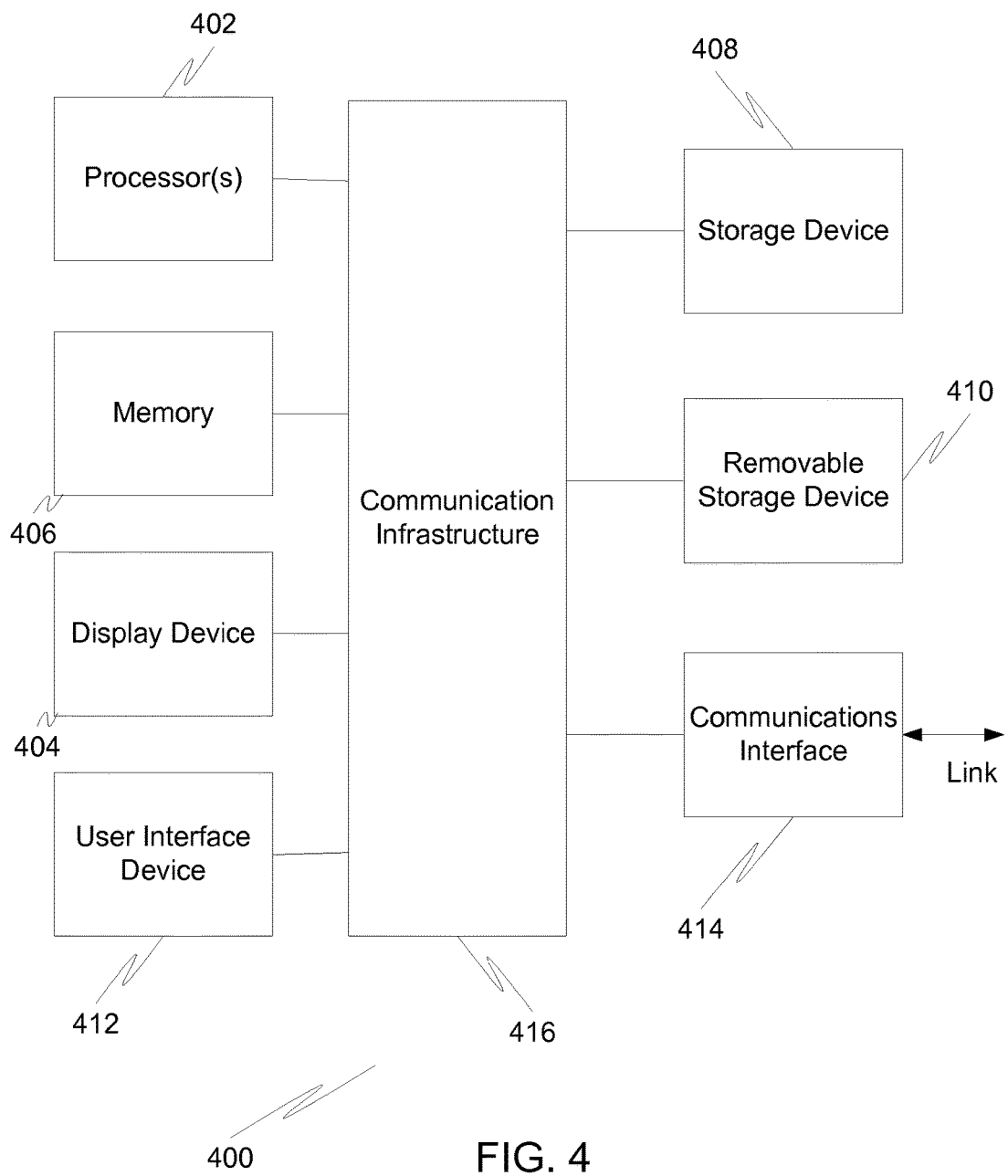
FIG. 4 illustrates a computer system, which is suitable for implementing a controller used in embodiments of the present invention.

FIG. 4 is a high level block diagram showing a computer system 400, which is suitable for implementing a controller 370 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The liquid is displaced with a drying solution (step 120). In this embodiment the drying solution comprises a solvent and a component that forms a solid, when at least some of the solvent is removed. In the specification and claims, a solid is defined as a substance that is crystalline, amorphous glass, or a material with a viscosity greater than 1 centipoise at the temperature at which the solid is maintained. In this embodiment, the drying solution is composed of poly(4-hydroxy styrene) dissolved in propylene glycol monomethyl ether acetate (PGMEA). In other embodiments, the drying solution may be composed of water and a water soluble polymer or other water dispersible solids. In addition, the drying solution may be composed of an organic solvent containing organic soluble polymers or other organic solvent dispersible solids. In another embodiment, a water or organic solvent solution containing monomer may be dispersed into the features and subsequently polymerized to form a solid polymer within the features. In another embodiment, a water or organic solvent solution containing polymer may be dispersed in the features and subsequently cross-linked to form a solid polymer network within the features. In this example, the drying solution is dispensed from the drying solution source 304.

Solvent is removed from the drying solution to cause a component of the drying solution to form a solid (step 124). Preferably, some of the solvent is removed by evaporation. In this example, the evaporation is caused by spinning the layer. The spinning is provided by the controller 370 signaling the motor 318 to rotate the axel 328, as indicated by the arrow around the axel 328. The axel 328 rotates the ESC 308, which rotates the substrate 212. In other embodiments, heat is used to cause the evaporation. The heat may be provided by the temperature controller 384, which causes heating of the ESC 308. In the alternative, a hot plate may be used to back the drying solution without any electrostatic clamping. In other embodiments, heat lamps above or below the wafer may be used to provide heat. In a preferred embodiment, the solvent is removed by spinning, without any additional heating. Preferably, the solid fills at least half the height of the spaces. More preferably, the solid fills the spaces. Most preferably, the solid over fills the spaces to fully counteract the capillary forces from solvent evaporation.

The solid is removed (step 128). Preferably, the solid is removed by an ashing process. In this example, the plasma source 352 provides a downstream plasma. A pressure of 1000 mTorr is provided. The downstream plasma uses a stripping gas of 3000 sccm $O_2$ and 200 sccm $N_2$. The stripping gas is formed into a plasma by the plasma source 352 using 1800 watts of RF. The solid is heated to 180° C. on a platen without electrostatic clamping. The temperature controller 384 is used to heat the solid. In another embodiment, UV light may be used to decompose and vaporize the solid, which is then pumped away in a vacuum chamber.

In experiments with high aspect ratio line and space structures (AR>11:1), it was found that without sacrificial bracing, a water rinse or even a lower surface tension PGMEA rinse process may provide greater than 80% collapse of the features after drying. The above example has been found to provide a collapse of 0% of the features after solid removal. In experiments with high aspect ratio cylinder structures (AR>15:1), a water rinse or even a lower surface tension PGMEA rinse process may provide greater than 97% collapse of the cylinders. The current invention has been found to provide a collapse of 0% of the cylinders after an optimized solid removal process.

In other embodiments, an oxide layer may be wet etched to release capacitor structures. In other embodiments, more of the steps may be accomplished in the same chamber or more of the steps may be accomplished in different chambers.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method, for drying an etched layer with a plurality of structures, with etched spaces between the plurality of structures, comprising:
   providing a liquid within the etched spaces on the etched layer;
   displacing the liquid with a drying solution including a solvent;
   removing some of the solvent from the drying solution to form a solid from the solution, wherein the solid at least fills half the height of the etched spaces; and
   subsequently removing the solid using downstream plasma ashing.

2. The method, as recited in claim 1, wherein the solid completely fills the etched spaces.

3. The method, as recited in claim 2, wherein the removing some of the solvent is by either spinning or heating, or both.

4. The method, as recited in claim 3, wherein the solid is removed by a combination of the downstream plasma ashing and UV degradation.

5. The method, as recited in claim 4, wherein the solid is either a crystalline, amorphous glass, or a material with a viscosity greater than 1 cP.

6. The method, as recited in claim 5, wherein the removing the solid has an infinite selectivity with respect to the etched layer material.

7. The method, as recited in claim 6, wherein the solid does not chemically react with the etched layer material.

8. The method, as recited in claim 7, wherein the solid overfills the etched spaces between the plurality of structures.

9. The method, as recited in claim 8, wherein the height of the etched spaces is at least 20 nm.

10. The method, as recited in claim 9, wherein the solvent is at least one of water or an organic solution and wherein the solution further comprises a polymer forming component.

11. The method, as recited in claim 1, wherein the etch layer is a silicon or metal based layer.

12. The method, as recited in claim 1, wherein at least some of the plurality of structures have an aspect ratio of at least 10:1.

13. The method, as recited in claim 1, wherein the removing some of the solvent is by either spinning or heating, or both.

14. The method, as recited in claim 1, wherein the solid is removed by ashing or UV degradation, or both.

15. The method, as recited in claim 1, wherein the solid is either a crystalline, amorphous glass, or a material with a viscosity greater than 1 cP.

16. The method, as recited in claim 1, wherein the solid does not chemically react with the etched layer material.

17. The method, as recited in claim 1, wherein the height of the etched spaces is at least 20 nm.

18. The method, as recited in claim 1, wherein the solvent is at least one of water or an organic solution and wherein the solution further comprises a polymer forming component.

19. An apparatus for drying a wet substrate, comprising:
   a chamber for receiving the wet substrate, the wet substrate including:
   (i) an etched layer with:
   (a) a plurality of structures; and
   (b) etched spaces between the plurality of structures; and (ii) a liquid disposed within the etched spaces on the etched layer;
a wet transfer station for transferring the wet substrate into the chamber;
an electrostatic chuck (ESC) for supporting and electrostatically clamping the wet substrate within the chamber;
a bracing drying solution source;
a bracing drying solution source dispenser dispensing bracing drying solution from the bracing drying solution source to the wet substrate, the bracing drying solution displacing the liquid and including a solvent;
a motor spinning the substrate to remove some of the solvent of the bracing drying solution, removal of the solvent of the bracing drying solution forming a solid from the bracing drying solution, wherein the solid at least fills half the height of the etched spaces;
a downstream plasma source providing a downstream plasma into the chamber to remove the solid via downstream plasma ashing;
a temperature controller for controlling the temperature of the substrate; and
a vacuum pump in fluid connection with the chamber.

* * * * *